United States Patent
Fraser et al.

(10) Patent No.: US 7,161,725 B2
(45) Date of Patent: Jan. 9, 2007

(54) FREQUENCY LOCKER

(75) Inventors: James Fraser, Torquay (GB); Stephen Pope, Towcester (GB); Colin Edge, Northampton (GB); Steven Borley, Towcester (GB); Lisa Daykin, East Hunsbury (GB); Kevin Mullaney, Cogenhoe (GB)

(73) Assignee: Bookham Technology PLC, Towcester (GB)

( * ) Notice: Subject to any disclaimer, the term of this patent is extended or adjusted under 35 U.S.C. 154(b) by 8 days.

(21) Appl. No.: 10/512,702

(22) PCT Filed: Apr. 25, 2003

(86) PCT No.: PCT/GB03/01807

§ 371 (c)(1),
(2), (4) Date: May 12, 2005

(87) PCT Pub. No.: WO03/091756

PCT Pub. Date: Nov. 6, 2003

(65) Prior Publication Data

US 2005/0225825 A1    Oct. 13, 2005

(30) Foreign Application Priority Data

Apr. 26, 2002   (GB)   ................. 0209568.5

(51) Int. Cl.
*G02B 26/00* (2006.01)
*G02B 27/10* (2006.01)
*G02B 27/30* (2006.01)
*H01S 3/10* (2006.01)
*H04J 14/02* (2006.01)

(52) U.S. Cl. ............ 359/238; 359/641; 359/618; 372/20; 372/21; 372/26; 372/32; 372/29.02; 398/93

(58) Field of Classification Search ........ 359/237–239, 359/618, 629, 639–641; 372/18, 20–22, 372/26, 29, 29.02, 31, 32, 50, 94, 98; 398/1, 398/9, 85, 93, 195; 250/216, 227.14; 385/24
See application file for complete search history.

(56) References Cited

U.S. PATENT DOCUMENTS 3,534,289 A * 10/1970 Clark et al. ................. 372/26

(Continued)

FOREIGN PATENT DOCUMENTS

EP       0 966 079 A    12/1999

(Continued)

OTHER PUBLICATIONS

IEE Colloquium on Optical Fibre Gratings (Digest No. 1997/037), pp. 13/1-13/6, "Laser wavelength stabilisation using fibre grating", Forbes et al, see especially fig 2.

*Primary Examiner*—Loha Ben
(74) *Attorney, Agent, or Firm*—Lahive & Cockfield LLP; Anthony A. Laurentano, Esq.

(57) ABSTRACT

A method and assembly for frequency stabilization of an optical signal especially from a laser, the assembly (11) comprising beam splitter (15), a passive frequency discriminator (16), and a pair of photodiodes (17 & 18). The beam splitter (15) in use receives a collimated optical beam (B) and diverts a sample beam ($B_1$) which is directed towards the discriminator (16) which transmits a portion ($B_2$) of said sample beam to one of the photodiodes (17) and reflects a second portion ($B_3$) of said sample beam to the other photodiode (18). A control signal ($S_3$) is derived from the respective intensities of the transmitted and reflected portions of the sample beam, and utilized to operate the electronic control to adjust the frequency of the laser output signal, if required, to maintain a specified frequency.

20 Claims, 4 Drawing Sheets

U.S. PATENT DOCUMENTS

| | | | |
|---|---|---|---|
| 5,396,361 A * | 3/1995 | Sasaki et al. | 398/1 |
| 5,798,859 A | 8/1998 | Ip et al. | |
| 6,091,526 A * | 7/2000 | Nogiwa | 398/195 |
| 6,094,446 A | 7/2000 | Tei et al. | |
| 6,289,028 B1 | 9/2001 | Allie et al. | |
| 6,323,976 B1 * | 11/2001 | Nogiwa | 398/93 |
| 6,389,046 B1 * | 5/2002 | Stayt et al. | 372/29.02 |
| 6,498,800 B1 * | 12/2002 | Watterson et al. | 372/20 |
| 6,526,079 B1 * | 2/2003 | Watterson et al. | 372/32 |
| 6,891,149 B1 * | 5/2005 | Lewis et al. | 250/227.14 |

FOREIGN PATENT DOCUMENTS

| | | |
|---|---|---|
| EP | 1 156 563 A | 11/2001 |
| EP | 1 158 631 A A | 11/2001 |
| EP | 1 345 297 A | 9/2003 |
| WO | WO-99/43060 A | 8/1999 |

* cited by examiner

FREQUENCY LOCKER

Related Applications

This application is a 35 U.S.C. 371 national stage filing of International Application No. PCT/GB03/01807, filed 25 Apr. 2003, which claims priority to Great Britain Patent Application No. 0209568.5 filed on 26 Apr. 2002, in Great Britain. The contents of the aforementioned applications are hereby incorporated by reference.

FIELD

This invention relates to a frequency locker for use with fixed, or tunable, lasers for locking the light output of the laser to a selected frequency, and is particularly, but not exclusively, for use with lasers in telecommunication systems.

BACKGROUND OF THE INVENTION

In this specification the term "light" will be used in the sense that it is used in optical systems to mean not just visible light but also electromagnetic radiation having a frequency between 100 THz and 375 THz.

In an optical fibre communication system, which uses light of a single frequency, the specific frequency of the laser source is not critical provided that it falls within the low insertion/dispersion characteristics of the optical fibre and bandwidth of the receiver. Provided that the bandwidth of the receiver is broad enough it will be able to detect a modulated signal if the laser source should drift or vary for any reason.

The frequency drift or variation may be due to operating temperatures, physical construction of the laser, and ageing characteristics of the laser materials. A distributed feedback (DFB) laser will shift about 10 GHz per ° C., in the C-Band communications band. Laser sources are therefore typically provided with temperature control devices.

The information carrying capacity of optical fibre communication systems can be increased by the use of wavelength division multiplex (WDM) systems in which a number of different frequency channels are carried over a single fibre. In WDM systems drift of the frequency channels constrains the number and spacing of the different channels and hence the data carrying capacity of the system.

There are two principal communication bands nominally centred on 231 THz (1300 nm) and 194 THz (1550 nm). The 194 THz band is the more utilised band because of its suitability for a variety of different generic communications applications. The 194 THz (1550 nm) WDM systems are presently evolving into systems comprising eighty (80), 2.5 Gb/s channels, and into forty (40), 10 Gb/s channels. The 194 THz communications band is located in the IR spectrum with International Telecommunication Union (ITU) channels spacings (ITU Grid) of 200, 100 and 50 GHz spread between 191 THz and 197 THz. The operating life ITU channel frequency stability specification for 194 THz (1550 nm) communication systems is typically set at 1.25 GHz variation over the operating life.

To provide 40 or 80 channels within the 194 THz band requires the use of a light source that can be accurately set to specific frequencies and be maintained at those frequencies (within limits) over the operating life. Suitable sources include distributed Bragg reflector (DBR) lasers each of which is operated to produce light of one frequency channel with means for selecting a required channel. Wide range tunable lasers have also been developed such as sample grating distributed Bragg reflector (SG-DBR) lasers as is described in Chapter 7, "Tunable Laser Diodes", Markus-Christian Amann and Jens Buus, Artech House, ISBN 0-89006-963-8. The tuning mechanism of SG-DBR lasers is by means of differential current steering of the operating frequency by means of currents supplied to the front and rear sample gratings of the Bragg reflector sections, with fine tuning being possible by means of the supply of a control current to the phase section. In general semiconductor lasers can be dynamically tuned either by means of current drive(s), electric field(s) control, or temperature control.

In order to prevent drift of a semiconductor laser's frequency devices are commercially available that perform the function of "frequency locking". One known device used for frequency locking is a Fabry Perot etalon filter, which is described in a paper entitled "A Compact Wavelength Stabilization Scheme for Telecommunication Transmitters", by B. Villeneuve, H. B. Kim, M. Cyr and D. Gariepy, published by Nortel Technology Ottawa, Canada.

A method of frequency locking is disclosed in U.S. Pat. No. 5,789,859 which describes a method in which an input signal is passed through a Fabry Perot etalon to provide a detected output signal having an intensity that varies with wavelength. A reference signal taken separately from the input signal is compared with the output signal detected from the etalon to provide a feedback signal that corresponds to the frequency of the input signal. The system is then calibrated to determine a ratio of intensities that determines a locked state. The frequency of the input signal can then be adjusted if the ratio falls outside of predetermined ratio limits.

The present invention provides an improved arrangement for a frequency locking device using a passive frequency discriminator (PFD).

STATEMENTS OF INVENTION

According to a first aspect of the present invention there is provided a frequency stabilisation assembly for a collimated optical signal which comprises a beam splitter, a passive frequency discriminator (PFD), and a pair of photodiodes, the beam splitter in use receiving a collimated optical beam and diverting, preferably substantially normal therefrom, a sample beam which is directed towards the PFD, the PFD transmitting a portion of said sample beam to one of said photodiodes, and reflecting a second portion of said sample beam to the other of said photodiodes.

Preferably, the PFD comprises a Fabry Perot etalon, and alternatively the PFD may comprise an interference filter.

The preferred beam splitter is a four port beam splitter having a collimated input beam inlet port, primary transmission outlet port; a farther port being both a sample beam transmission and reflection input port, and a reflected sample beam transmission port, the latter two ports being arranged normally of the collimated input port and primary transmission beam port, characterised in that the portion of the sample beam reflected by the PFD passes back through the beam splitter towards the second diode.

The beam splitter directs typically a maximum sample of 10%, more typically in the range of 1–5%, and preferably about 5%, of the beam towards the PFD, the sample beam being preferably normal to the optical beam.

The two photodiodes are tilted relative to the received sample beam such that they are equally tilted in opposite rotational directions, preferably by about 2° of arc.

Another aspect of the invention provides a laser module comprising a laser sub-assembly including a collimating lens for collimating the laser output, and a frequency stabilisation assembly according to the first aspect of the invention.

The laser sub-assembly and frequency stabilisation assembly are mounted on a plate having a high thermal Conductivity, for example a copper tungsten plate, for minimising the temperature differential therebetween. The module may include a thermister located adjacent the laser and connected to a thermo-electric control for control of the temperature within the laser module.

An optical isolator may be located adjacent the main beam input of the frequency stabilisation assembly to prevent back reflection from the assembly.

The module may further include electronic controls which receive signals from the two photodiodes, process said signals and produce a feedbacks signal for control of the frequency of the optical signal from the laser. The electronic control processes the differences between the two photodiode signals to produce a difference signal which is utilised for control of the laser. The two photodiode signals may be buffered and input to a difference amplifier capable of phase inversion of the input signals.

A third aspect of the invention provides a method of frequency stabilisation of an optical signal of specified frequency from a laser having an electronic control, the method comprising diverting a sample beam from the collimated optical signal beam from the laser into a passive frequency discriminator (PFD) which transmits a first portion of the beam and reflects a second portion of the sample beam, producing a control signal derived from the respective intensities of the transmitted and reflected portions of the sample beam, and utilising the control signal to operate the electronic control to adjust the frequency of the laser output signal, if required, to maintain a specified frequency.

The sample beam removed from the signal beam by means of a beam splitter which diverts typically 5% of the signal beam. The beam splitter permits substantially zero deviation of the optical axis.

Preferably the reflected portions and transmitted portions of the sample beam pass normally across the main signal beam. The transmitted portion and reflected portion of the sample beam in the preferred embodiment are each substantially about 50% at the desired optical signal frequency, but are dependant upon the frequency of the signal.

The relative intensities of the two light sample portions are used to produce a difference signal indicative of the difference therebetween, and the electronic control compares the difference signal against a stored predetermined reference value and controls the laser frequency to equalise the stored predetermined reference value and difference signal.

Two light sample portions are fed into photodiodes to produce signals indicative of their relative light intensities.

A summation of said signals indicative of light intensity is used to monitor the optical signal power output from the laser.

Where the PFD has a frequency characteristic having a free spectral range of 2X GHz and full width half maximum of X GHz, the preferred embodiment stabilisation assembly can be used to produce frequency stabilisation points at spacings of both 2X and X GHz, although the points at X GHz spacings are determined with the aid of a phase inversion-of the difference signal.

DESCRIPTION OF THE DRAWINGS

The invention will be described by way of example and with reference to the accompanying drawings in which.

DETAILED DESCRIPTION OF THE INVENTION

For ease of understanding the invention will be principally described with reference to the preferred embodiment of a frequency locker, according to the invention, using a Fabry Perot etalon as a passive frequency discriminator.

Figure 1A:
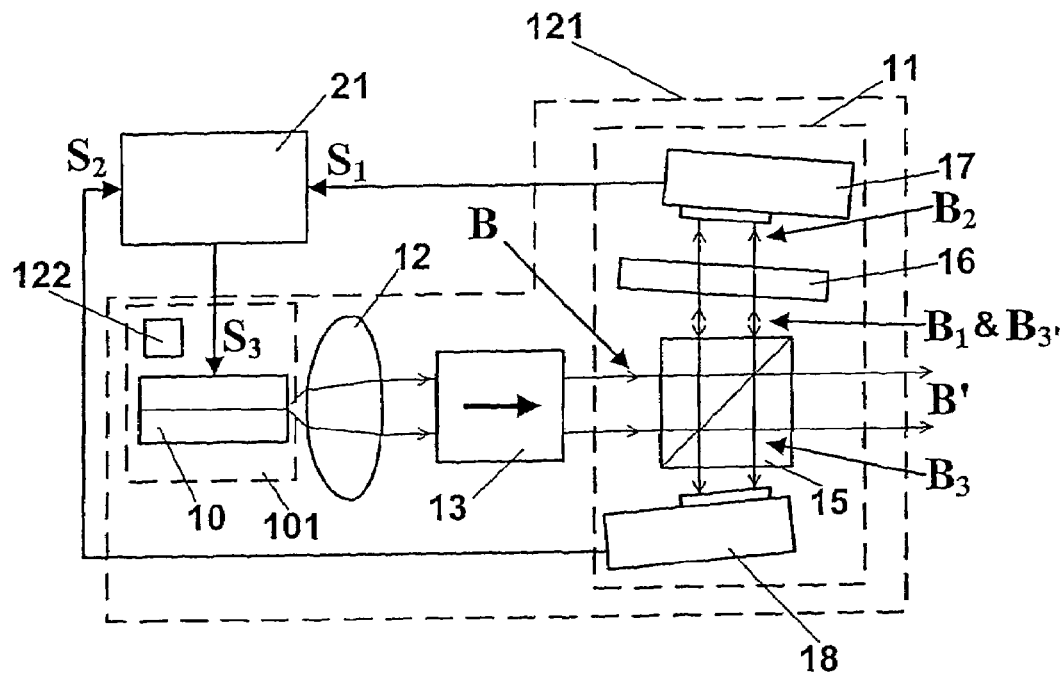
FIG. 1a. is a schematic drawing of a frequency locker according to the preferred invention embodiment, FIG. 1b. is a schematic drawing of a frequency locker according to an alternative preferred invention embodiment, FIG. 2. is a schematic drawing of a laser module with integral frequency locker assembly, FIG. 3. is an example graph showing transmitted and reflected photodiode responses for the frequency locker assembly of FIG. 1a., FIG. 4a. is an example graph showing the transmitted photodiode response for the frequency locker assembly of FIG. 1b., FIG. 4b. is an example graph showing part of the transmitted photodiode response for the frequency locker assembly of FIG. 1b., FIG. 4c. is an example graph showing the differential signal characteristics for the frequency locker assembly of FIG. 1b., and FIG. 5. is a schematic drawing of a beam splitter for use with a frequency locker of FIG. 1a. or 1b.

With reference to FIG. 1a., there is shown a laser device 10, being either a fixed frequency laser such as a distributed feedback laser (DFB), or tunable frequency laser such as a distributed Bragg reflector (DBR), mounted with a thermister 122 on a laser sub assembly 101, with a frequency stabilisation assembly 11, which can be co-packaged with other optical devices, not shown, such as, for example, an electro-optic modulator for telecommunications applications.

Light from the laser device 10 is collimated by a collimating lens 12 and transmitted through an optical isolator 13 as a parallel beam B.

The beam B is then passed into the frequency locker assembly 11. The locker comprises an optical beam-splitter device 15, a passive frequency discriminator (PFD) 16, and a pair of photodiodes 17 & 18.

The laser sub-assembly 101 and the other optical components in the locker assembly 11, are all mounted on an optical assembly plate 121 having a high thermal conductivity. The optical output from the frequency locker 11 may be coupled through a second optical isolator, not shown, depending on the specific application of the frequency locker assembly.

The photodiode 17, 18 electrical signals $S_1$ and $S_2$ are interfaced to the control electronics 21, which is in turn interfaced to the laser diode to provide the closed loop control of the laser operating frequency.

The laser diode device 10 ultimately provides the light output to the WDM system. The thermister 122 is located adjacent the laser diode device 10 to maintain accurate control of the laser temperature since the laser has the highest sensitivity to frequency variation caused by temperature change in the optical configuration.

The light from the laser diode device 10 is collimated by the lens 12 located close to the front facet to provide a plane wavefront to the optical components in the locker assembly, in particular to the PFD.

Figure 5:
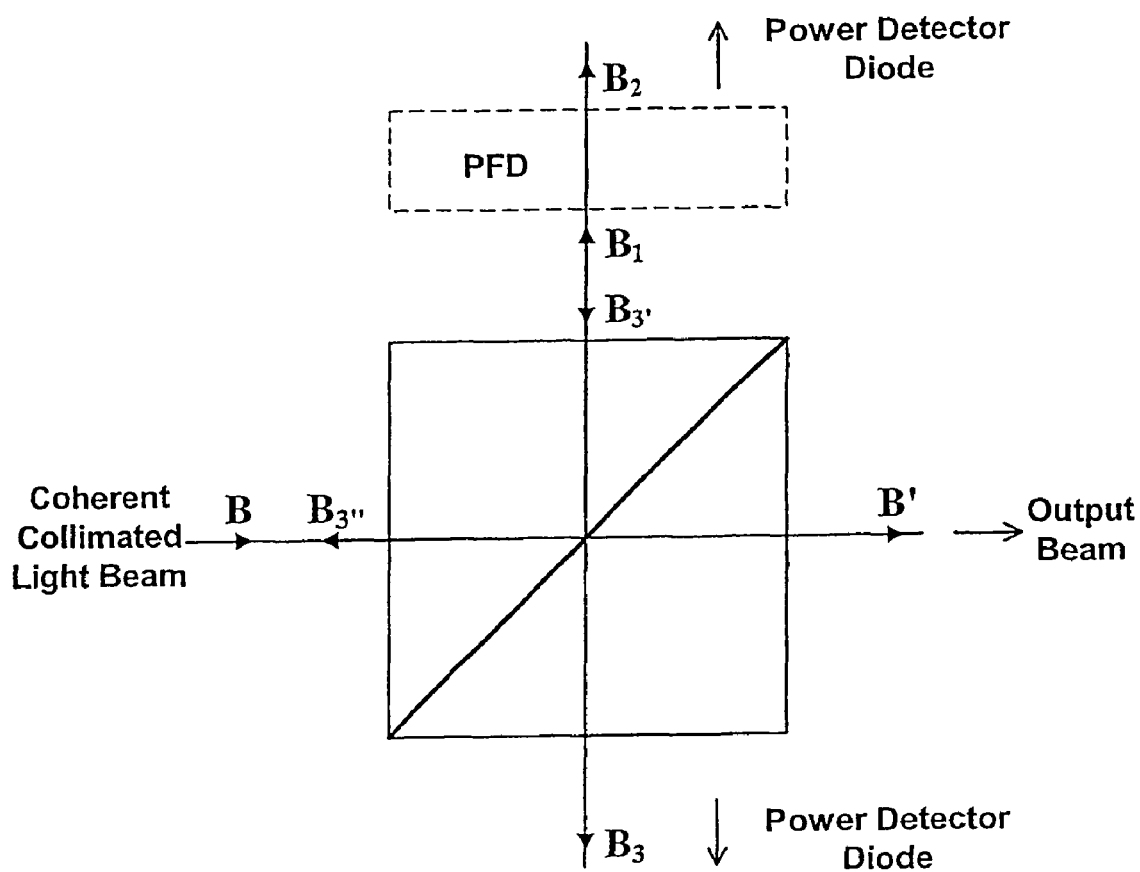

With reference to FIG. 5., the beam-splitter 15, notionally a cube, is a four port optical component consisting of light inlet, outlet and inlet/outlet ports. The beam-splitter device can, for example, be a plate type beam-splitter, or a cube type beam-splitter. The beam-splitter transmits, in part, the collimated beam sourced by the laser diode 10, onward to the module output optics or to further co-packaged electro-optic devices, for example, a modulator. The beam-splitter 15 diverts a small fraction $B_1$, typically 5%, of the collimated beam B power and hence typically 95% of the collimated beam power is available for the output B'. The 5% sample beam $B_1$, is substantially normal to the collimated beam B, and is directed towards the PFD. The PFD has a wavelength dependent transmission characteristic, and transmits a portion $B_2$ of the sample beam $B_1$, and reflects the remainder portion as a beam $B_{3'}$. The reflected portion $B_{3'}$ from the PFD traverses back across the beam-splitter, again substantially normal to the main collimated beam B. As the beam-splitter has typically 95% transmission, most of the PFD reflected light $B_{3'}$ light passes through the beam-splitter to emerge as a beam $B_3$, with a small fraction $B_{3''}$ being reflected and lost in the optical isolator 13.

An aspect of the optical design is that the beam-splitter permits substantially zero deviation of the main beam B/B', and thus keeps the optical axis straight. This is especially important for co-packaged module applications to avoid an off-set optical input into, for example, a downstream semiconductor electro-optic modulator.

As stated the PFD 16 transmits a portion, $B_2$, of the diverted light $B_1$ and reflects the rest as a beam $B_{3'}$. The portion $B_2$ of transmitted sample light depends upon its frequency and passes through to a photodiode 17, which monitors the light intensity of the transmitted sample light. The PFD reflected light power $B_{3'}$, ultimately emerges, in most part, as beam $B_3$, which is detected by photodiode 18 which monitors its intensity.

Figure 3:
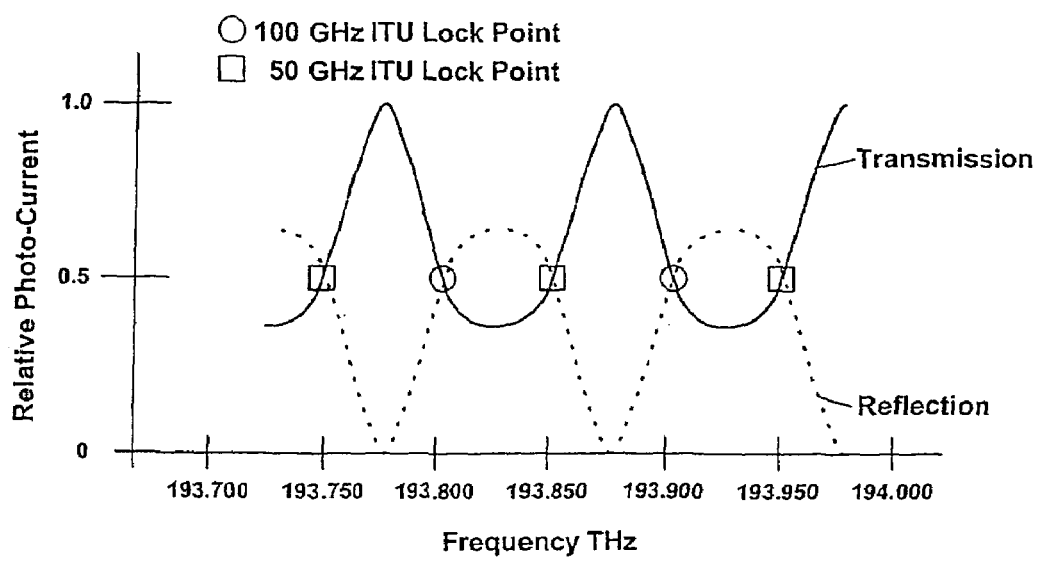

In the preferred embodiment of the invention the PFD comprises a Fabry-Perot etalon. An etalon, for this application, has a frequency dependent transmission characteristic typically as shown in FIG. 3., which can be used to provide a feedback signal to the laser diode device 10, allowing frequency locking. For a PFD using an etalon, the etalon transmission characteristic is selected to provide a 100 GHz free spectral range (FSR), determined by the thickness of the etalon optical cavity. To allow locking to the 50 GHz ITU grid frequencies, the finesse of the etalon is selected to be typically close to 2 so that the full width half maximum (FWHM) of the etalon transmission characteristic is approximately, or exactly, 50 GHz. Small variations in the absolute finesse are accommodated in the control unit 21, during calibration. The FWHM is given by the equation $$FWHM = FSR/Finesse \quad (1)$$

Advantageously, this avoids the need to use a much thicker etalon in order to achieve the 50 GHz frequency lock points. Clearly, this ability to obtain both 100 GHz and 50 GHz lock points using a smaller etalon helps reduce space requirements within the frequency locker assembly 11.

The etalon 16 temperature coefficient is chosen to provide, in conjunction with the advantages of the small physical size of the optical assembly and the high thermal conductivity of the optical assembly plate 121, the necessary thermal stability required for correct operation over the temperature range 0° C. to 70° C., Typically the etalon 16 temperature coefficient will be 0.06 GHz per ° C. With a typical 50 GHz WDM channel spacing the invention design leads to a frequency stability of ±1.25 GHz.

A supplier of etalons suitable for this application is WavePrecision, Bedford, Mass., USA.

During fabrication of the frequency locker assembly 11, in the preferred embodiment using a PFD comprising a Fabry Perot etalon, the passive frequency discriminator 16 is actively angularly aligned within the locker assembly 11 to achieve locking in the midpoint channel of the ITU grid, thereby to minimise free spectral range (FSR) walk-off at the extreme channels at the edge of, for example, the C-Band (190.1–196.65 THz). 100 GHz FSR etalons are typically manufactured to FSR tolerances of ±0.04 GHz.

Frequency locking is obtained from electronic processing of the difference between the etalon transmission and reflection signals. Locking may be obtained on both sides of the etalon transmission characteristics, and since the separation of lock points on either side of the etalon characteristic is now 50 GHz, locking to the 50 GHz ITU grid frequencies is possible using a selected 100 GHz etalon. Referring to FIG. 1a., photodiodes 17 and 18 convert the transmitted and reflected light power from the PFD into photo-currents to provide electrical signals $S_1$ and $S_2$ respectively. Preferably, these signals interface with the control electronics 21. Each photodiode converts the incident light into photo-current with a responsivity of typically 1 mA/mW i.e. to a first order, the photo-current is directly proportionate to optical power. Each photodiode is mounted at typically 2°, to the light incident upon it to reduce optical reflections back into the optical system. Each photodiode is rotated in-the opposite sense to the other, as shown, for example, in FIG. 1a, so that optical phase differences in the detected signals from the PFD are reduced. This is particularly advantageous in permitting the detected light powers to be used in determining main beam optical power i.e. to act as power monitors. A suitable photodiode for this application is available from LGP Electro Optics, Woking, Surrey, UK, as part number GAP1060.

The photodiode signals $S_1$ and $S_2$ provide inputs to the control electronics 21. These signals are then buffered and input to a difference amplifier which includes phase inversion of the input signals as appropriate to enable locking on both sides of the etalon PFD slope characteristic as shown in FIG. 3.

The frequency locker assembly 11, uses only a single beam splitter 15 to tap off a small fraction, typically 5%, of the laser beam B thereby giving low insertion loss and maintaining most power in the main beam. With the preferred embodiment the locked frequency is achieved at nominally 50% passive frequency discriminator transmitted power, and 50% reflected power, by utilising the difference between reflected and transmitted light intensity for both the 50 GHz and 100 GHz cases.

With the laser device 10, operating nominally at an ITU frequency, the difference between $S_1$ and $S_2$ is compared with a reference value stored in the control electronics 21. The control electronics then operates to adjust the laser frequency, using a suitable control signal means, $S_3$, dependent on the frequency control means of the laser device 10, such that the photodiode difference signal is equal to the stored reference value. Since the laser diode operating frequency is sensitive to both temperature and drive current or field, closed loop control of the operating frequency may be implemented by either changing the laser electrical operating conditions, or by changing the thermoelectric control (TEC) set point temperature. If the laser frequency changes from the required value, the photodiode difference signal deviates away from the stored value and the control electronics 21 produces an error signal proportional to this deviation. By configuring the polarity of the error signal correctly $S_3$ can be directed to steer the laser device 10 back to the correct ITU frequency thus minimising the error and keeping the laser held at the required operating frequency. This constitutes a feedback control loop. In the case where the laser device 10 is a tunable laser the control electronics will need to adapt to each required laser device frequency and drive the laser tuning means accordingly, as well as, adopt appropriate stored reference values for each ITU frequency of operation. An exemplary storage means for both single frequency and multiple frequency operating frequency data, is a look-up-table.

The stored value(s) in the control electronics 21 is determined during factory test of the module, such that the stored reference value is specific to both the exact frequency being tested and locked, and the specific unit undergoing test, and constitutes a predetermined reference value. By testing each operating frequency in turn and storing a corresponding reference value in the control electronics 21, each operating frequency can be set to match the ITU grid to within a specified accuracy. Whilst, the difference between $S_1$ and $S_2$ is the quantity compared with a stored reference value, those skilled in the art will appreciate that other data derived from $S_1$ and $S_2$ may be used for the comparison with an appropriate stored predetermined reference value or set of values.

The operation of phase inversion of the difference signal, in the control electronics of the preferred embodiment using a PFD comprising a Fabry Perot etalon, is dependent on the frequency being locked. Phase inversion is required between locked frequencies having a 50 GHz separation, since these lie on opposite sides of the 100 GHz etalon characteristic, see FIG. 3. Phase inversion may be applied at any appropriate point within the control electronics 21, for example, to the error signal produced from the photodiode difference signal and the reference signal amplitude stored in the control electronics.

Figure 1B:
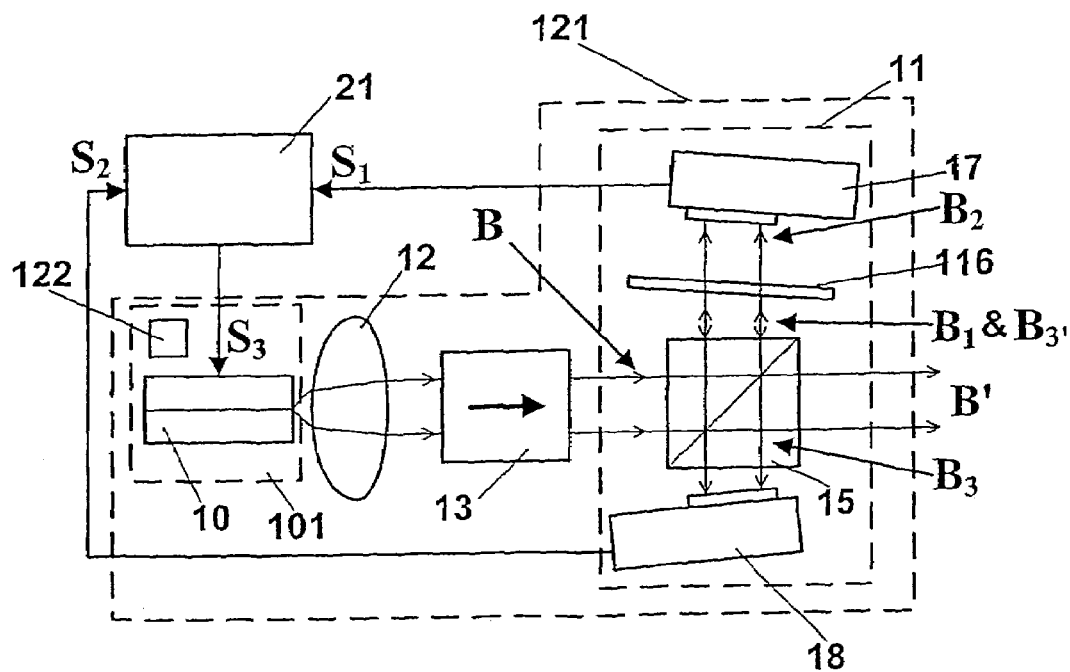

In an alternative preferred embodiment of the invention the PFD comprises an interference filter. FIG. 1b. shows schematically a frequency locker according to the alternative preferred embodiment.

Referring to FIG. 1b. the embodiment is exactly the same as that shown in FIG. 1a., save that the PFD 116 has been changed to being an interference filter. The operation of the frequency locker in this alternative embodiment is as described for the preferred embodiment using a Fabry Perot etalon PFD except where detailed below.

Figure 4A:
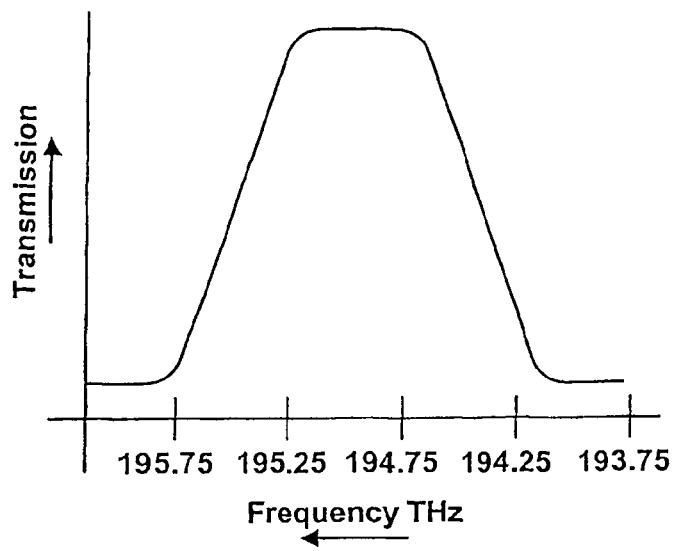
Figure 4B:
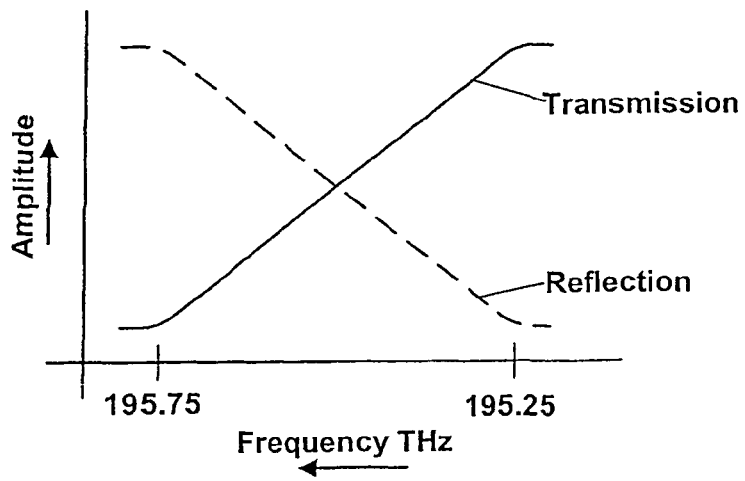
Figure 4C:
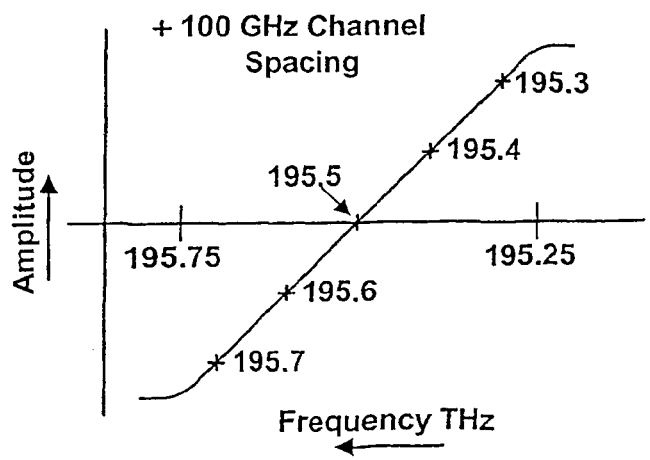

An interference filter can be used to generate a frequency dependent signal by utilising its transmission characteristic on one side of the peak transmission curve shown in FIG. 4a. Consider the left-hand side of the curve, over a finite frequency range, this transmission response is monotonically decreasing with increasing frequency, and the reflection characteristic is correspondingly monotonically increasing with increasing frequency. Frequency locking is again obtained by processing the difference between the transmission and reflection characteristics of the interference filter, save that the lock point is now a pre-determined amplitude of the difference signal, which is frequency dependent as shown in FIG. 4c. The operating frequency range of the interference filter can be selected according to the application required, for example, a narrow band filter can be used to provide frequency locking for a fixed frequency laser such as a DFB laser, and a wide band filter can be used to provide frequency locking for a tunable laser such as a DBR laser. With an interference filter configuration, the centre frequency of the filter must be selected according to the particular application and the operating frequencies/channels to be covered. The interference filter may be operated on either side of its transmission characteristic, depending on the particular application required.

FIG. 4a. shows an interference filter in which the transmission characteristic is substantially linear, on the left hand side, say from 195.25 THz through 195.75 THz i.e. over 500 GHz range. Thus such a filter can encompass 5, 100 GHz ITU channels or 10, 50 GHz channels. FIG. 4b. shows this substantially linear portion of the transmission characteristic and its corresponding reflection characteristic. These are approximately linear over the exemplary frequency range of interest. The gradient of the transmission and reflection characteristic is relatively low, and by using the difference between the two responses, an approximately linear transfer function is obtained with double the gradient i.e. twice the sensitivity to frequency deviation, as shown in FIG. 4c. One skilled in the art will appreciate that the differential signal can be created using the signals $S_1$ and $S_2$ in the control electronics 21 of FIG. 1b. To allow for variation of the laser 10 output power intensity the differential signal ($S_1-S_2$) has to be normalised by dividing by the summation signal ($S_1+S_2$).

Referring to FIG. 1b., to use this differential signal to lock the laser device 10, it is first normalised, and then the normalised amplitude of the differential signal is compared with a predetermined reference amplitude, corresponding to the desired ITU channel frequency, obtained during final test of the frequency locker and stored with the unit. In use deviation of the difference signal from the target ITU channel stored value is used to produce a steering signal to control the laser device frequency tuning means to minimise this deviation i.e. to lock the frequency of the laser. Whilst, the difference between $S_1$ and $S_2$ is the quantity compared with a stored reference value, those skilled in the art will appreciate that other data derived from $S_1$ and $S_2$ may be used for the comparison with an appropriate predetermined reference value or set of values.

Advantageously, the alternative embodiment does not require alignment of the filter during assembly as its transmission characteristic is not highly sensitive to angle of incidence. Further, interference filters can be made with very low temperature coefficients, typically 0.05 GHz/° C. Further, locked wavelength intervals are determined during manufacture and stored with the unit thus allowing selected channel spacings e.g. 100 GHz, 50 GHz, 25 GHz. with no impact upon the locker design. Further, the exact location of the operating frequency on the interference filter slope is not critical to the frequency locker operation since the control electronics provides a reference signal calibration to negate this effect. Further, interference filters can be small and compact and have a substantially linear response over 1000 GHz, allowing for 10, 100 GHz ITU channels to be covered.

Figure 2:
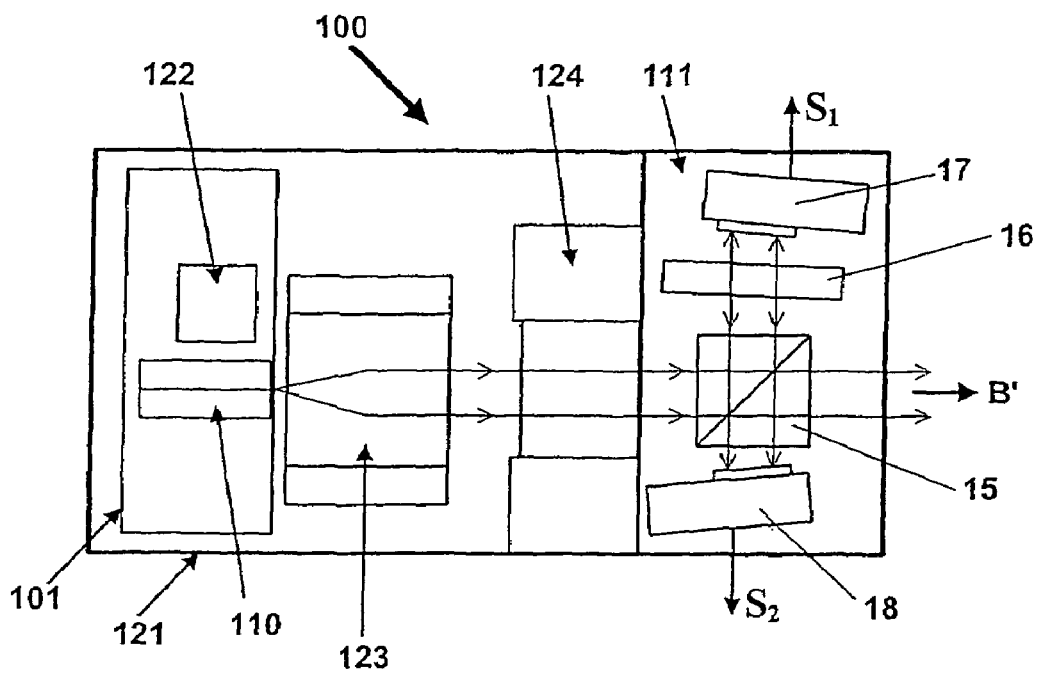

With reference to FIG. 2., there is shown a module 100 having a laser assembly 101 comprising, for example, a tunable laser 110 which may, for example, be of a type disclosed in GB 2337135, with an adjacent thermister 122, a collimating lens 123 and optical isolator 124 and, for example, a 50 GHz integrated frequency locker assembly 111, all mounted on a single mounting plate made of, for example, copper/tungsten (CuW) 121. The locker 111 is as shown as 11 in FIGS. 1a. or 1b. and where applicable the same reference numbers are used for its internal components.

The mounting-plate is operated at a substantially constant temperature, with closed loop temperature control using the thermister 122 adjacent the laser device 110 and a thermo-electric cooler (TEC), not shown, below the mounting plate. The mounting plate has ideally a high thermal conductivity to minimise the thermal gradient between the thermister 122, and the PFD 16, and to reduce the thermal impedance between the thermister 122, and the TEC.

The main collimated beam passing through the beam-splitter from the laser may be additionally isolated from subsequent optics by using a second optical isolator, not shown, of similar form to the first optical isolator. This has the advantage of protecting the locker photodiodes from optical reflections generated further down the optical path, for example, from outside the optical module at an optical connector interface. The requirement for an additional isolator is dependent on the specific application for the frequency locker assembly.

The laser beam is collimated by collimating lens 123 and passes through an optical isolator 124 to the beam splitter 15 which is specified to sample typically 5% of the beam. The reflected sample beam is directed to the passive frequency discriminator 16 having a 100 GHz FSR as previously described.

For the exemplary tunable laser 110 the lock point for the ITU spaced channels is achieved by taking the difference between the photodiode signals $S_1$ and $S_2$ from the passive frequency discriminator transmitted and reflected response respectively as is shown in FIG. 3. The signals $S_1$ and $S_2$ are processed, in electronics not shown in FIG. 2, but discussed above, to produce a feedback control signal $S_3$, as shown in FIG. 1a., which is used to control, for example, the phase section of the tunable laser and hence the operating frequency of the laser.

As shown in FIG. 3, with such a design the all even numbered channels will all occur on one edge of the PFD's transmission response, whilst the odd numbered channels will all occur on the other edge of the PFD's transmission response. Such an organisation of channel numbers may be used to facilitate faster channel changing systems.

This arrangement also permits the same 100 GHz etalon to be used to tune the laser to a 50 GHz spacing. A typical 50 GHz etalon is significantly larger than a 100 GHz etalon, for example up to twice the thickness. Thus this size reduction represents a considerable advantage in the manufacture of devices where physical space is at a premium.

The module 100 when using the alternative preferred embodiment frequency locker assembly 111, it can be adapted to use a wide-band interference filter as the PFD 16, to provide locking for a tunable laser of limited tuning range, for example, a three section distributed Bragg reflector (DBR) semiconductor laser. Alternatively, with this alternative preferred embodiment the frequency lockers assembly 1111 can adapted to use a narrow-band interference filter as the PFD 16, to provide locking for a fixed frequency laser such as a distributed feedback (DFB) semiconductor laser.

Advantageously, with any of the described embodiments summation of the transmission and reflection signals $S_1$ and $S_2$ may be used to act as a monitor for the main beam power output fed forward from the laser device 10/110. The photodiodes 17, 18 are configured so that they are tilted in opposite directions with respect to the incident light to minimise optical phase differences between the detected optical signal from the PFD 16. This allows the sum of the photodiode signals to be used since the summed photo-currents is proportional to the typically 5% diverted light from the beam-splitter with good linearity to collimated beam power and a response that is not wavelength dependent.

Advantageously, the collimated beam from the laser device 10/110, allows a variety of different PFDs to be used in the frequency locker configuration 111, which allows a degree of flexibility in the locker design and enables the specification of the PFD optical performance to be precisely controlled.

The use of a beam-splitter 15 in the main collimated beam with the diverted beam substantially normal to the main beam enables a very compact physical layout for the locker assembly 111, which can consequently be incorporated on the same platform 100 as the laser device.

The PFD 16 is a small physical component in both embodiments. This enables the compact physical layout which is important for minimising the thermal gradient between the thermister 122 and the PFD 16 to reduce the locked frequency error especially as a function of the module operating case temperature variation.

The detected signals from the photodiodes 17, 18 sample a small fraction of the incident collimated beam power, but provide large detected photo-currents as the laser device 10/110 is organised to provide most of the optical power from its front facet. In addition, the use of both the transmission and reflection characteristic from the PFD input to a difference amplifier in the control electronics 21 serves to nominally double the sensitivity of the resulting error signal to a finite change in operating frequency. This provides the frequency locker assembly with a high sensitivity and enables a locker design with high frequency stability to be achieved.

The method of mounting the laser assembly 101 and frequency locker assembly 111, on a high thermal conductivity mounting plate 121 allows the use of PFDs with a finite temperature coefficient to be used in a locker configuration with high frequency stability. The high thermal conductivity also contributes to the design enabling the laser temperature control alone to provide the temperature stability for the locker assembly with no further active devices, hence the design is thermally and electrically efficient.

The optical isolator 124 on the input of the frequency locker assembly 111, is useful in eliminating reflections either from the locker optical surfaces or from farther along the optical path, including the system in which the module 100 is installed, from interfering with a laser susceptible to back reflections and thereby affecting operating frequency and power.

An optical isolator on the output side of the frequency locker assembly 111, not shown, can be useful in eliminating optical back reflections from the host system from interfering with the detected photo-currents and thereby reducing the locked frequency accuracy.

The invention claimed is:

1. A frequency stabilization assembly for a collimated optical signal, comprising a beam splitter, a passive frequency discriminator (PFD), and a pair of photodiodes, the beam splitter in use receiving a collimated optical beam and diverting therefrom a sample beam which is directed towards the PFD, the PFD transmitting a first portion of said sample beam to one of said photodiodes, and reflecting a second portion of said sample beam to the other of said photodiodes, wherein the PFD comprises a Fabry Perot etalon that has a frequency characteristic having a free spectral range of substantially 2X GHz and a full width half maximum of substantially X GHz allowing frequency stabilization points at spacings of both 2X and X GHz.

2. The assembly of claim 1, wherein the beam splitter comprises a four port beam splitter having a collimated input beam inlet port, primary transmission outlet port; a further port being both a sample beam transmission and reflection input port, and a reflected sample beam transmission port, wherein the further port and the reflected sample beam transmission port are arranged normally of the collimated input beam inlet port and the primary transmission outlet port, wherein the second portion of the sample beam reflected by the PFD passes back through the beam splitter towards the other photodiode.

3. The assembly of claim 1, wherein the beam splitter directs a sample of 5% of the beam towards the PFD.

4. The assembly of claim 1, wherein the pair of photodiodes are tilted relative to the sample beam such that they are equally tilted in opposite rotational directions.

5. The assembly of claim 4, wherein the photodiodes are tilted by an angle of about 2 degrees of arc.

6. A laser module comprising a laser sub-assembly including a collimating lens for collimating a laser output, and a frequency stabilization assembly as claimed in claim 1.

7. The laser module of claim 6, wherein the laser sub-assembly and frequency stabilization assembly are mounted on a plate having a high thermal conductivity for minimizing a temperature differential therebetween.

8. The laser module of claim 6, further comprising a thermister located adjacent the laser module and connected to a thermo-electric control for control of a temperature within the laser module.

9. The laser module of claim 6, further comprising an optical isolator located adjacent a main beam input of the frequency stabilization assembly to prevent back reflection from the assembly.

10. The laser module of claim 6, further comprising an electronic control which receives signals from the pair of photodiodes, processes said signals, and produces a feedback signal for control of the frequency of the optical signal from the laser module.

11. The laser module of claim 10, wherein the electronic control processes the differences between the photodiode signals to produce a difference signal which is utilized for control of the laser.

12. The laser module of claim 11, wherein the photodiode signals are buffered and input to a difference amplifier capable of phase inversion of the signals.

13. A method of frequency stabilization of an optical signal of specified frequency from a laser having an electronic control, the method comprising
diverting a sample beam from the optical signal from the laser into a passive frequency discriminator (PFD) which transmits a first portion of the sample beam and reflects a second portion of the sample beam,
producing a control signal derived from the respective intensities of the first and second portions of the sample beam, and
utilizing the control signal to operate the electronic control to adjust the frequency of the laser output signal to maintain a specified frequency, wherein the PFD comprises a Fabry Perot etalon that has a frequency characteristic having a free spectral range of substantially 2X GHz and a full width half maximum of substantially X GHz allowing frequency stabilization points at spacings of both 2X and X GHz.

14. The method of claim 13, further comprising the step of removing the sample beam from the optical signal with a beam splitter which diverts about 5% of the optical signal.

15. The method of claim 14, wherein the beam splitter permits substantially zero deviation of the optical axis.

16. A method of claim 13, wherein the first and second portions of the sample beam pass normally across the optical signal.

17. The method of claim 13, wherein the first and second portions of the sample beam are each substantially about 50% at the desired optical signal frequency thereof.

18. The method of claim 13, wherein the relative intensities of the first and second portions of the sample beam are used to produce a difference signal indicative of the difference therebetween, and the electronic control compares the difference signal against a predetermined stored reference value and controls the laser frequency to equalize the stored reference value and the difference signal.

19. The method of claim 13, wherein the first and second portions of the sample beam are fed into the pair of photodiodes to produce signals indicative of their relative light intensities.

20. The method of claim 19, wherein a summation of said signals indicative of light intensity is used to monitor a power output of the optical signal.

* * * * *